United States Patent (12)
Noda et al.

(10) Patent No.: US 7,277,306 B2
(45) Date of Patent: Oct. 2, 2007

(54) ASSOCIATIVE MEMORY CAPABLE OF SEARCHING FOR DATA WHILE KEEPING HIGH DATA RELIABILITY

(75) Inventors: Hideyuki Noda, Itami (JP); Katsumi Dosaka, Itami (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 168 days.

(21) Appl. No.: 11/148,320

(22) Filed: Jun. 9, 2005

(65) Prior Publication Data
US 2005/0289407 A1    Dec. 29, 2005

(30) Foreign Application Priority Data
Jun. 14, 2004    (JP) .............................. 2004-175860

(51) Int. Cl.
    G11C 15/00    (2006.01)
    G11C 7/00    (2006.01)
(52) U.S. Cl. ............... 365/49; 365/189.07; 365/230.03
(58) Field of Classification Search .................. 365/49, 365/189.07, 200, 230.03, 233, 154, 156
    See application file for complete search history.

(56) References Cited

U.S. PATENT DOCUMENTS

| 6,700,827 B2 | 3/2004 | Lien et al. |
| 6,807,081 B2 * | 10/2004 | Nii ............................. 365/156 |
| 6,816,396 B2 * | 11/2004 | Chai et al. ..................... 365/49 |
| 6,924,995 B2 * | 8/2005 | Lien ............................. 365/49 |
| 6,978,343 B1 * | 12/2005 | Ichiriu .......................... 365/49 |
| 6,987,684 B1 * | 1/2006 | Branth et al. ................. 365/49 |

FOREIGN PATENT DOCUMENTS

JP    2003-316662    11/2003

OTHER PUBLICATIONS

*J.A. Fifield et al., "High-Speed On-Chip ECC for Synergistic Fault-Tolerant Memory Chips", IEEE Journal of Solid-State Circuits, vol. 26, No. 10, Oct. 1991, pp. 1449-1452.
*Masaaki Mitani, "Industrial Mathematics for Restudy", CQ Publishing Co., Ltd., Jan. 1, 2001, pp. 47-53.

* cited by examiner

Primary Examiner—Trong Phan
(74) Attorney, Agent, or Firm—Buchanan Ingersoll & Rooney PC

(57) ABSTRACT

A CAM unit has a memory array for storing storage data, and a RAM unit has a memory array for storing the same storage data and check bits added thereto for determining whether the storage data in its memory array has an error. An error correction circuit uses the check bits to correct any error of data read from the memory array of the RAM unit and rewrite the error-corrected data to the memory arrays. Even if a soft error occurs in the storage data, the check bits can be used to correct the error in the data and rewrite the error-corrected data. Thus, a matching comparison can be performed on the storage data with high reliability.

12 Claims, 10 Drawing Sheets

ASSOCIATIVE MEMORY CAPABLE OF SEARCHING FOR DATA WHILE KEEPING HIGH DATA RELIABILITY

BACKGROUND OF THE INVENTION

1. Field of the Invention

The present invention relates to a content addressable memory (associative memory, also referred to as CAM hereinafter) having an error correction capability.

2. Description of the Background Art

Generally, the CAM is called associative memory having the capability of reading data from a physical address like RAM (Random Access Memory) and ROM (Read-Only Memory) for example as well as the capability of searching for data on a memory array that has the same value as that of input data to output the physical address of the matching data or output a detection signal.

The CAM is used widely in such applications as address conversion for asynchronous transfer mode (ATM) and high speed IP (Internet Protocol) for example and is used versatilely in various fields.

Here, it is supposed that, in a memory array of a CAM, a bit error is caused by a hardware failure. In this case, even if data with correct content is input, the input data does not match the data having the bit error. Although the memory should normally output the match result, actually a desired output cannot be obtained.

Regarding this issue, Japanese Patent Laying-Open No. 2003-316662 discloses that, rewriting of data stored at an address having such a bit error is inhibited, or mask control is performed by excluding the address having the bit error from addresses to be searched for, so as to efficiently search for data. Thus, the CAM is required to ensure the good quality of the device and high data reliability.

In addition to a bit error due to a hardware failure, an error could occur when such natural radiation as α radiation and neutron radiation is incident on a CAM chip to generate positive hole pairs in a silicon substrate and thereby break data held on a storage node of a memory cell in the worst case. Such an error is generally called soft error.

It is known that, as the capacity of a storage node holding data is smaller, the resistance to soft errors is lower. Occurrences of bit errors due to soft errors result in loss of reliability of the search result of the CAM as described above.

If a bit error occurs in a memory array of a CAM due to any hardware failure as described above, measures can be taken in advance to address the occurrence of the error, using such methods as those disclosed in the aforementioned publication. However, it is difficult to prepare any measure to address the occurrence of a bit error caused by a soft error that occurs in a later stage.

In particular, with the recent advances in semiconductor process technology, namely downsizing technology, the size of a memory cell itself has been decreasing and accordingly the capacity of a storage node holding data has gradually been decreasing. Thus, there is a tendency that the bit error rate due to soft errors increases.

SUMMARY OF THE INVENTION

The present invention has been made to solve the aforementioned problem and an object of the present invention is to provide an associative memory capable of searching for data while maintaining high data reliability, with an increased resistance to soft errors.

According to the present invention, an associative memory includes: a first memory unit including a plurality of memory cell rows that store data and performing a matching comparison between input search data and storage data stored in advance correspondingly to each memory cell row; a second memory unit storing, correspondingly to each memory cell row, information that is the same as the storage data stored in the first memory unit and check data used for checking the storage data; and a control unit for determining whether the storage data has a soft error based on the check data stored in the second memory unit and correcting the storage data stored in the first memory unit.

The associative memory includes, according to the present invention, in addition to the first memory unit performing a matching comparison with storage information, the second memory unit storing the same information as the storage information stored in the first memory unit. Based on the information stored in the second memory unit, the control unit corrects a soft error of the storage information stored in the first memory unit. In this way, the associative memory of the present invention can perform a matching comparison based on the storage information having high reliability.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
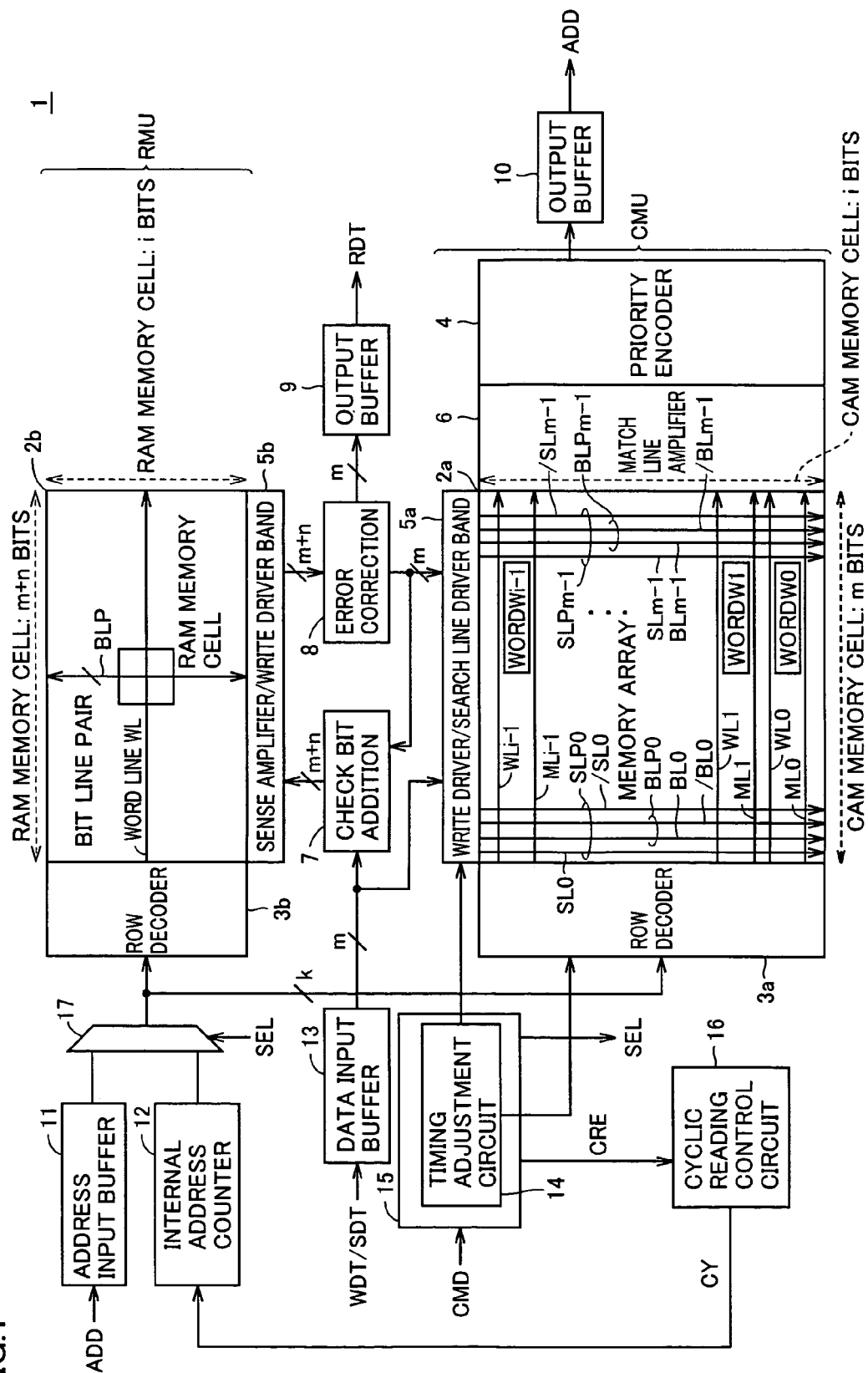
FIG. 1 shows an entire configuration of an associative memory according to a first embodiment of the present invention.

Embodiments of the present invention are hereinafter described in detail with reference to the drawings. In the drawings, like components are denoted by like reference characters and a description thereof is not repeated.

First Embodiment

Referring to FIG. 1, an associative memory 1 according to an embodiment of the present invention includes a CMU of a CAM unit (hereinafter CAM CMU) chiefly for performing a matching comparison between data, i.e., searching for data, an RMU of a RAM unit (hereinafter RAM RMU) for reading data for example, and peripheral circuitry for controlling them. Specifically, the peripheral circuitry includes a check bit addition circuit 7, an error correction circuit 8, output buffers 9, 10, an address input buffer 11, an internal address counter 12, a data input buffer 13, a control circuit 15 for controlling the whole of associative memory 1, a cyclic reading control circuit 16 for controlling cyclic reading discussed hereinlater, and a selector 17.

Configuration of CAM CMU

The CAM CMU includes a memory array 2a having memory cells arranged in rows and columns for storing storage information used for the matching comparison, namely for searching for data (the memory cells are also referred to as CAM memory cells hereinafter), a row decoder 3a, a priority encoder 4, a write driver/search line driver band 5a, and a match line amplifier 6.

Memory array 2a includes word lines WL0-WLi-1 (i is a natural number of at least 1) (the word lines are also referred to generally as word lines WL) as well as a plurality of match lines ML0-MLi-1 (also referred to generally as match lines ML) arranged correspondingly to respective memory cell rows, bit line pairs BLP0-BLPm-1 (also referred to generally as bit line pairs BLP) arranged correspondingly to respective memory cell columns, and search line pairs SLP0-SLPm-1 (also referred to generally as search line pairs SLP) arranged correspondingly to respective memory cell columns. In this example, an exemplary configuration of memory array 2a with i rows×m columns is described.

A bit line pair BLP includes a bit line BL and a complementary bit line /BL. A search line pair SLP includes a search line SL and a complementary search line /SL. In FIG. 1, as representative ones, bit line BL0 and complementary bit line /BL0 of bit line pair BLP0, bit line BLm-1 and complementary bit line /BLm-1 of bit line pair BLPm-1, search line SL0 and complementary search line /SL0 of search line pair SLP0, and search line SLm-1 and complementary search line /SLm-1 of search line pair SLPm-1 are shown.

As shown in FIG. 1, memory array 2a has i memory cell rows and i words W0-Wi-1 designated by successive addresses are stored in respective memory cell rows. In this example, it is supposed that word W0 corresponds to the least significant address and word Wi-1 corresponds to the most significant address.

Row decoder 3a selects (accesses) at least one of a plurality of word lines WL0-WLi-1 according to an input address.

Write driver/search line driver band 5a receives write data that is input in a data write operation to transmit, to each of a plurality of bit line pairs BLP, a signal of a predetermined logic level according to the write data. Further, receiving input search data that is input in a data search operation, write driver/search line driver band 5a transmits, to each of a plurality of search line pairs SLP, a signal of a predetermined logic level according to the input search data. In this example, it is supposed that, in the data write operation, data are written in parallel to memory cells of a memory cell row corresponding to select word W. It is further supposed that, in the data search operation, a matching comparison is performed on all words W (all memory cell rows) stored in the memory array.

Match line amplifier 6 amplifies a match signal transmitted to each of match lines ML0-MLi-1 in the data search operation to output the amplified signal to priority encoder 4. Based on the match signal transmitted from match line amplifier 6 in the data search operation, priority encoder 4 generates the most significant address of the matching memory cell row and outputs the address.

Output buffer 10 buffers and outputs an address ADD that is output from priority encoder in the data search operation.

Configuration of CAM Memory Cell

Figure 2:
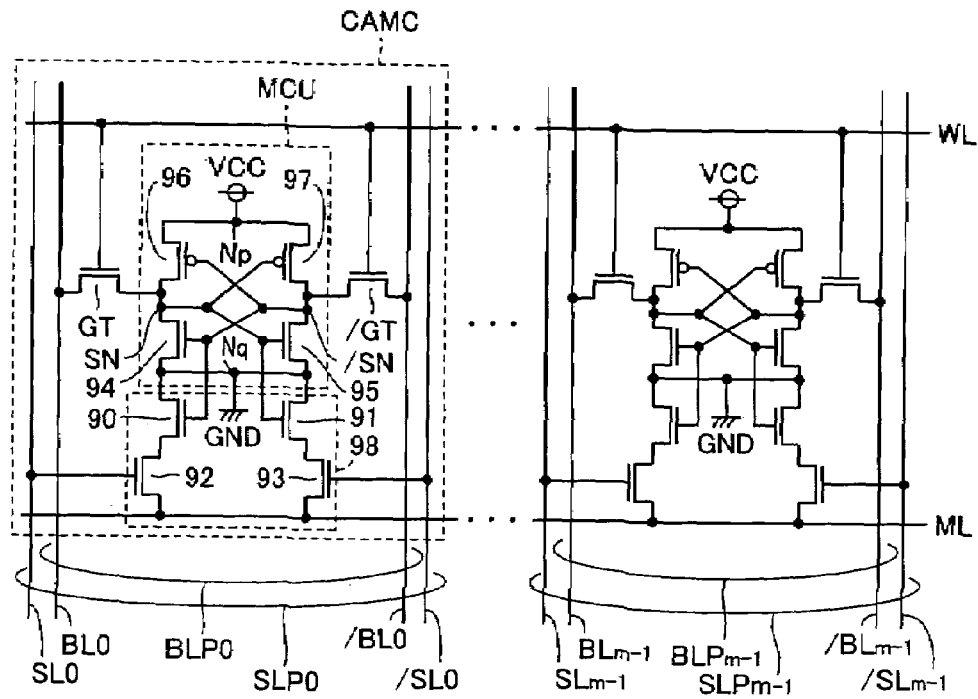
FIG. 2 shows a circuit configuration of CAM memory cells arranged in a memory array according to the first embodiment of the present invention.

Referring to FIG. 2, CAM memory cells CAMC (also referred to simply as memory cells CAMC hereinafter) are arranged in memory array 2a according to the first embodiment of the present invention. Here, two memory cells CAMC corresponding to bit line pairs BLP0 and BLPm-1 are provided. Since memory cells CAMC are similar to each other in configuration, the configuration of memory cell CAMC corresponding to bit line pair BLP0 is described as a representative one.

Memory cell CAMC includes a memory cell unit MCU, gate transistors GT, /GT and a comparison unit 98.

Memory cell unit MCU includes transistors 94-97. It is supposed here that transistors 94, 95 are N-channel MOS transistors and transistors 96, 97 are P-channel MOS transistors. Transistor 96 is provided between a node Np supplied with a power supply voltage VCC and a sense node SN and has its gate electrically coupled to a sense node /SN. Transistor 97 is provided between node Np supplied with power supply voltage VCC and sense node /SN and has its gate electrically coupled to sense node SN. Transistor 94 is provided between sense node SN and a node Nq supplied with a ground voltage GND and has its gate electrically coupled to sense node/SN. Transistor 95 is provided between sense node /SN and node Nq supplied with ground voltage GND and has its gate electrically coupled to sense node SN. Memory cell unit MCU composed of transistors 94-96 is a so-called cross-coupled SRAM cell (static memory cell) that holds storage data by setting one of sense nodes SN and /SN at logical "H" level and setting the other at logical "L" level.

In this example, it is supposed that the setting of sense nodes SN and /SN at "L" level and "H level respectively corresponds to storage data "0", and the setting of sense nodes SN and /SN at "H" level and "L" level respectively corresponds to storage data "1". Here, the settings for storage data "0" and "1" may be reversed.

Gate transistor GT is provided between bit line BL0 and sense node SN and has its gate electrically coupled to corresponding word line WL. Gate transistor /GT is provided between sense node /SN and bit line /BL0 and has its gate electrically coupled to corresponding word line WL.

Comparison unit 98 makes a matching comparison between storage data stored in memory cell unit MCU and input search data. Comparison unit 98 includes transistors 90-93. It is supposed here that transistor 90-93 are N-channel MOS transistors.

Transistors 90 and 92 are connected in series between node Nq supplied with ground voltage GND and corresponding match line ML and have respective gates electrically coupled to sense node SN and search line SL0 respectively. Transistors 91 and 93 are connected in series between node Nq supplied with ground voltage GND and corresponding match line ML and have respective gates electrically coupled to sense node /SN and search line /SL0 respectively. As described above, since memory cell unit MCU is equivalent to a so-called cross-coupled SRAM cell, a detailed description of the operations of reading and writing data is not provided here. The SRAM cell serves as a flip-flop circuit that sets one and the other of the two sense nodes at different voltage levels respectively according to data to be stored.

Bit line pair BLP provided correspondingly to memory cell CAMC is used in the data write operation. Search line pair SLP is used in the data search operation.

Data Search Operation

Figure 3:
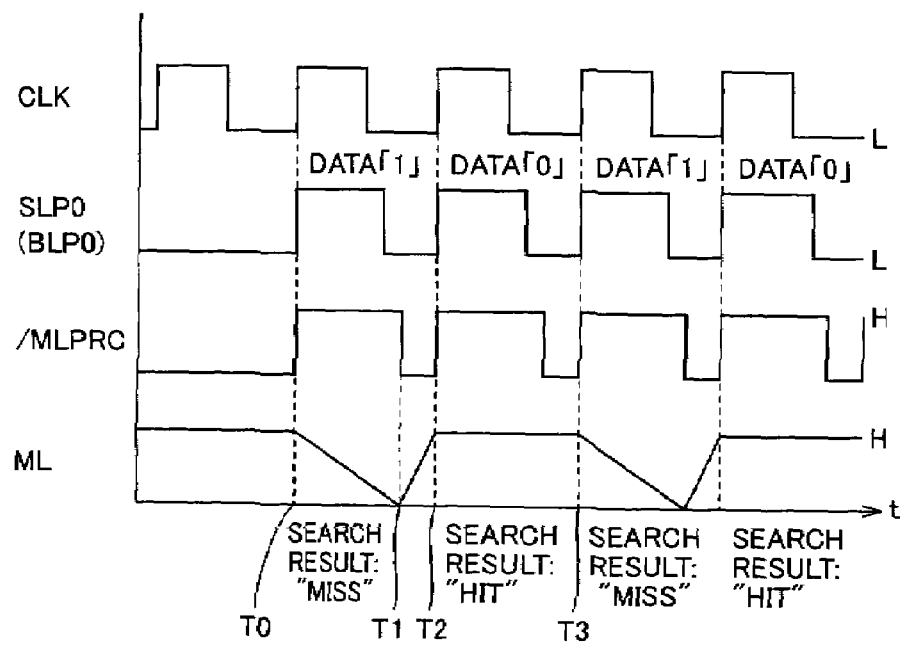
FIG. 3 is a timing chart illustrating a data search operation of memory cells corresponding to a search line pair described in connection with FIG. 2.

Using the timing chart in FIG. 3, a data search operation of memory cell CAMC corresponding to search line pair SLP0 is described. It is supposed here that internal circuitry operates in synchronization with a clock signal CLK and the description is given accordingly. Further, it is supposed that memory cell CAMC stores storage data "0". For the sake of simplicity, the description is given here assuming that input search data SDT of one-bit data is input.

At time T0 in synchronization with a rise of the clock signal, data is transmitted to search line pair SLP0 according to input search data SDT ("1"). Specifically, search line SL0 and complementary search line /SL0 are set respectively at "H" level and "L" level. In response to this, in a comparison unit 98 of memory cell CAMC, transistor 92 is turned on. Since memory cell CAMC stores storage data "0", sense nodes SN and /SN are set respectively at "L" level and "H" level. Accordingly, in comparison unit 98, in response to the voltage level of sense node /SN, transistor 90 is turned on. Accordingly, in comparison unit 98, both of series-connected transistors 90 and 92 are turned on to electrically couple match line ML and node Nq supplied with ground voltage GND. Thus, the voltage level of match line ML is pulled down by ground voltage GND from a predetermined precharge voltage level ("H" level). In this case, therefore, it is determined that the one-bit storage data stored in memory cell CAMC does not match the input search data and the search result is thus "miss" or mismatch.

Then, at time T1 after the search result is obtained, a control signal /MLPRC for precharging match line ML is set at "L" level. Accordingly, a precharge circuit (not shown) is activated by receiving control signal /MLPRC ("L" level) to precharge match line ML to the predetermined voltage level ("H"). In this way, a preparation for the following data search operation is finished.

Then, at time T2 in synchronization with a rise of the clock signal, data is transmitted to search line pair SLP0 according to input search data ("0"). Specifically, search line SL0 and complementary search line /SL0 are set respectively at "L" level and "H" level. In response to this, in comparison unit 98 of memory cell CAMC, transistor 93 is turned on. As described above, since memory cell CAMC stores storage data "0", transistor 90 in comparison unit 98 is turned on. Thus, in comparison unit 98, match line ML and node Nq supplied with ground voltage GND are not electrically coupled to each other. Accordingly, the voltage level of match line ML is kept at the predetermined voltage level ("H" level). Thus, in this case, it is determined that the storage data stored in memory cell CAMC and the input search data match and, the search result is "hit" or match. After time T3, in synchronization with subsequent rises of clock signal CLK, the data search operation is similarly carried out in response to input of input search data.

Actually, in addition to the comparison for the single memory cell, namely the one-bit data, similar operations are performed in parallel on memory cells of a memory cell row to set the voltage level of match line ML. Specifically, when comparison units 98 of all memory cells CAMC of the memory cell row do not electrically couple corresponding match line ML and ground voltage GND, corresponding match line ML is kept at the predetermined voltage level ("H" level). In other words, it can be determined that the input search data and the storage data stored in each memory cell CAMC of a predetermined memory cell row match.

In contrast, when at least one of comparison units 98 of memory cells CAMC included in the memory cell row electrically couples corresponding match line ML and ground voltage GND, corresponding match line ML is set at the voltage level of ground voltage GND ("L" level). In other words, it is determined that the input search data and the storage data stored in each memory cell CAMC of the predetermined memory cell row do not match. Operations similar to this are performed in parallel on respective memory cell rows. The voltage level set at match lines ML0-MLi-1 each is used as a match signal and amplified by match line amplifier 3 to be input to priority encoder 4.

Receiving the match signal transmitted from each of a plurality of match lines ML0-MLi-1, priority encoder 4 generates the most significant address of the matching memory cell row and outputs the address.

Configuration of RAM RMU

Referring again to FIG. 1, a configuration of the RAM RMU is described.

According to the present invention, information that is the same (same number of words) as the storage information stored in memory array 2a of the CAM CMU is stored in the RAM RMU and check information for performing an error correction which is described hereinlater is also stored in the RAM RMU.

The RAM RMU includes a memory array 2b having memory cells (also referred to as RAM memory cells hereinafter) arranged in rows and columns, a row decoder 3b and a sense amplifier/write driver band 5b.

The RAM memory cells arranged in memory array 2b each correspond to the CAM cell described in connection with FIG. 2 from which comparison unit 98 and search line pair SLP are removed, namely correspond to an SRAM cell having only a memory cell unit MCU. This memory array 2b has the configuration of i lines×(m+n) columns. Word lines WL and bit line pairs BLP are similar in configuration to those of memory array 2a described above and the detailed description is not repeated here.

Row decoder 3b activates a predetermined word line WL according to an input address. Sense amplifier/write driver band 5b amplifies a data signal that is transmitted through bit line pair BLP in a data read operation and outputs the amplified data signal to error correction circuit 8. In a data write operation, sense amplifier/write driver band 5b transmits to bit line pair BLP a data signal of a predetermined logic level according to write data.

Configuration of Peripheral Circuitry

Control circuit 15 receives an external command CMD for controlling the whole of the associative memory to generate and output various control signals for instructing internal circuits to execute predetermined operations.

Cyclic reading control circuit 16 is activated in response to an activation signal CRE ("H" level) to generate a count-up signal CY that is a periodic signal and output the signal to internal address counter 12.

Address input buffer 11 receives an address ADD input thereto to buffer and output the address to selector 17. Internal address counter 12 generates therein an address to output the generated address. Specifically, in response to count-up signal CY which is a periodic signal, internal address counter 12 successively increments an address to output the address to selector 17. Selector 17 selects one of the address from address input buffer 11 and the address from internal address counter 12 according to a control signal SEL to output the selected one to row decoders 3a and 3b. Specifically, in a normal data read operation and a normal data write operation, selector 17 outputs the address from address input buffer 11 to row decoders 3a and 3b in response to control signal SEL ("H" level). In a cyclic read operation described hereinlater, selector 17 outputs the address from internal address counter 12 to row decoders 3a and 3b in response to control signal SEL ("L" level). Here, the logic level of control signal SEL may be reversed for these operations.

Data input buffer 13 buffers write data WDT or input search data SDT which is used for data search. Write data WDT is output to check bit addition circuit 7 and to a write driver band of write driver/search line driver band 5a and input search data SDT is output to a search line driver band of write driver/search line driver band 5a.

Check bit addition circuit 7 receives write data WDT from data input buffer 13, adds predetermined check bits used for an error correction described hereinlater, and outputs the data, for writing it to the RAM RMU, to the write driver band of sense amplifier/write driver band 5b of the RAM RMU.

Error correction circuit 8 receives read data that is output from a sense amplifier band of sense amplifier/write drier band 5b of the RAM RMU, performs an error correction and outputs the data to output buffer 9, write driver/search line driver band 5a of the CAM CMU and check bit addition circuit 7.

Data Writing of Words W Constituting Storage Information

Data writing of words W constituting storage information before the data search operation is started is described.

In this case, when a certain word W is written at a predetermined address of memory array 2a of the CAM CMU, simultaneously the same data of the word W is also written, at the same address position as memory array 2a of the CAM CMU, in memory array 2b of the RAM RMU. In other words, word W written in memory arrays 2a and 2b is stored in both of the CAM CMU and the RAM RMU.

Figure 4:
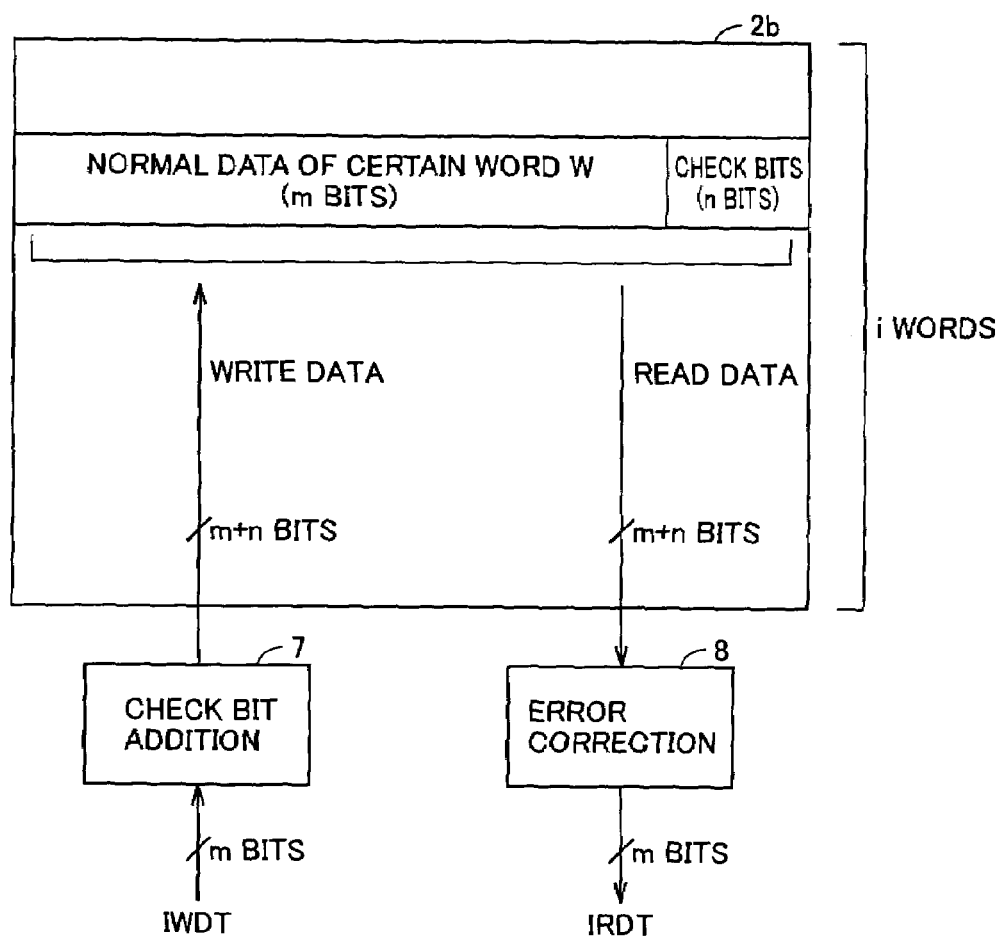
FIG. 4 conceptually illustrates information stored in the memory array according to the first embodiment of the present invention.

With reference to FIG. 4, information stored in memory array 2b in this embodiment of the invention is described. It is supposed here that write data IWDT shown here refers to write data WDT buffered by data input buffer 13 and read data IRDT refers to read data RDT before being buffered that is to be output from output buffer 9.

Write data IWDT of m-bit word W is input to check bit addition circuit 7. Check bit addition circuit 7 adds, as check bits used for the error correction, n bits to write data IWDT. The resultant data is written to memory array 2b as write data of (m+n) bits at the same address position as the word W written in memory array 2a of the CAM CMU.

Similarly, check bit addition circuit 7 adds n bits as check bits to all words W and outputs the resultant words as write data IWDT.

Data Reading of Words W Constituting Storage Information

Generally, for an associative memory, a data search operation is performed to output a matching address. Therefore, a data read operation of words stored in the memory is rarely carried out. However, the data read operation is performed in order to check for example the data stored in the memory, in response to an instruction from control circuit 15. In this case, since the present embodiment writes the same words W in both of the CAM CMU and the RAM RMU as described above, data is read from one of them, namely from the RAM RMU and the data is output to the outside through error correction circuit 8.

Specifically, in the data read operation, (m+n) bits are read as read data of word W from the RAM RMU according to an input address and the read data is output to error correction circuit 8.

Error correction circuit 8 performs an error correcting operation using such an error correction code as so-called Hamming code.

In the error correcting operation, when the n bits of the check bits are used to detect a bit error in the normal m-bit data, the bit error is specified and an error correction is made, for example, the error bit is inverted to output m-bit read data IRDT. Read data IRDT that is read from the RAM RMU is output through output buffer 9 as m-bit read data RDT.

When an error correction is made using the Hamming code, it is necessary for check bit addition circuit 7 to define Hamming-coded check bits. The bit number of the check bits is determined so that the relation $2^n - m \geq m+1$ is satisfied by the normal m-bit data and the n-bit check bits. Hamming coding is performed through calculation based on a predetermined exclusive OR (syndrome tree) for data of each bit of the normal m bits to define the n-bit check bits. Check bit addition circuit 7 adds the n-bit check bits to the normal m bits to output the resultant bits. The combination of the check bits represents positional information for specifying where an error, namely a bit error occurs. A so-called syndrome is calculated. When data is read, error correction circuit 8 receives the n-bit check bits to calculate this syndrome. Based on the result of the calculation, a table specifying the position of the error bit is referred to and the data is changed. This general Hamming coding theory is described for example in "Industrial Mathematics for Restudy", CQ Publishing Co., Ltd., pp. 47-53. Here, the error correction of the present invention can also use a parity code instead of the Hamming code and naturally, an error correction based on any of other coding theories is also applicable.

Regarding the data search operation, the data search operation is performed on the CAM CMU as the conventional art.

In the present embodiment, in parallel with the data search operation performed on the CAM CMU, the data read operation is performed on the RAM RMU repeatedly. The repeatedly performed data read operation is also referred to as cyclic reading hereinafter and a series of operations is described below.

Control circuit 15 receives a cyclic reading command to activate activation signal CRE ("H" level) and sets control signal SEL at "L" level.

Cyclic reading control circuit 16 is activated in response to activation signal CRE ("H" level) to output count-up signal CY that is a periodic signal to internal address counter 12.

Internal address counter 12 generates an address through increment in synchronization with count-up signal CY, and selector 17 outputs the address of internal address counter 12 according to control signal SEL ("L" level) to row decoders 3a and 3b.

Accordingly, from the RAM RMU, using addresses generated in synchronization with count-up signal CY and changed sequentially one by one, data is read.

As described above, read data that is read from the RAM RMU is input to error correction circuit 8. On the data read from the RAM RMU, error correction circuit 8 performs an error correction using the check bits described above.

The error-corrected data is input again as rewrite data to the RAM RMU and the CAM CMU and a data write operation is performed on a memory cell row according to an input address to row decoders 3a and 3b.

This cyclic reading is executed for enhancement of the resistance to soft errors, namely for data maintenance (data repair) and does not output the read data. In other words, in operation, the error correcting operation is constantly performed in the RAM RMU and the CAM CMU so that any bit error occurring due to a soft error can be repaired in a considerably short period of time. When a normal data read operation, not the cyclic reading, for the purpose of checking for example data is performed, control circuit 15 receiving a command to execute the normal data reading temporarily stops the cyclic reading. Specifically, activation signal CRE for activating cyclic reading control circuit 16 is inactivated ("L" level). Accordingly, count-up signal CY that is a periodic signal from cyclic reading control circuit 16 is blocked. Then, the generation of addresses by internal address counter 12 is interrupted. Further, when the normal data reading is performed, control circuit 15 sets control signal SEL at "H" level. Specifically, as described above, selector 17 outputs an address from address input buffer 11 to row decoders 3a and 3b. After the data read operation for checking data for example is done and read data RDT is output from-output buffer 9, in response to an instruction from control circuit 15 according to input of a cyclic reading command, activation signal CRE is again set at "H" level so that control signal SEL is set at "L" level to cancel the interruption of the address generation by internal address counter 12 and the cyclic reading is continued again.

With this configuration, the resistance to soft errors can be enhanced, the reliability of storage information stored in the associative memory can be improved and accordingly the operation of searching for data can be executed.

Timing Adjustment of Data Rewrite in CAM CMU

In a data search operation, for data maintenance (data repair) of the CAM CMU, it is necessary to activate word line WL of memory cells in the CAM CMU because rewrite to the CAM CMU is performed.

Figure 5:
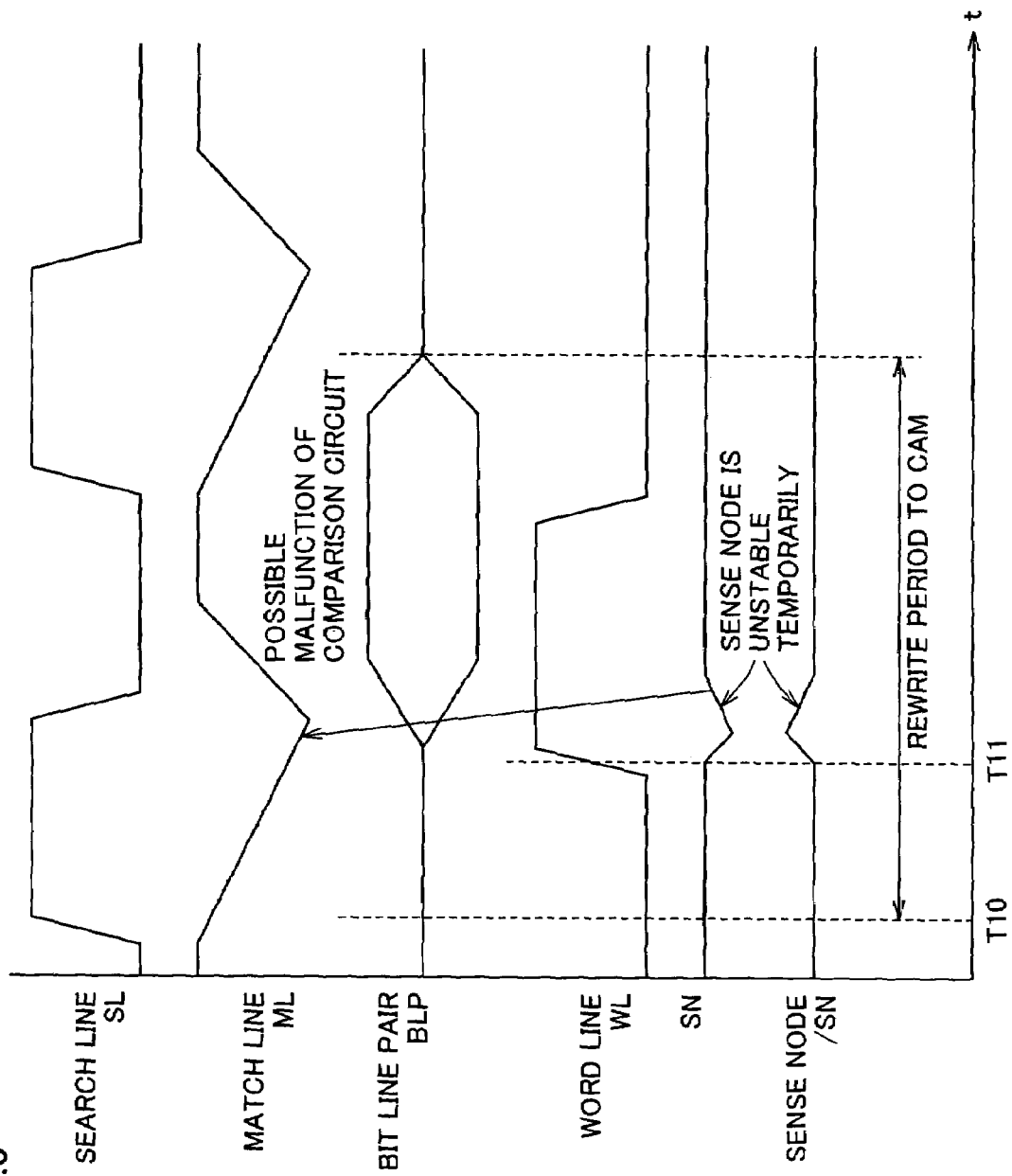
FIG. 5 shows a case where malfunction of a data search operation could occur.

In this case, if word line WL is activated and thereafter a voltage level according to write data is transmitted through error correction circuit 8 to bit line pair BLP, sense nodes SN, /SN are electrically coupled in the state in which data on bit line pair BLP has not been confirmed, as shown in FIG. 5. Thus, the potential levels of sense nodes SN, /SN change at time T11. If the data search has been conducted since time T10, malfunction of the potential level of search line SL could occur, namely the data search could malfunction.

Figure 6:
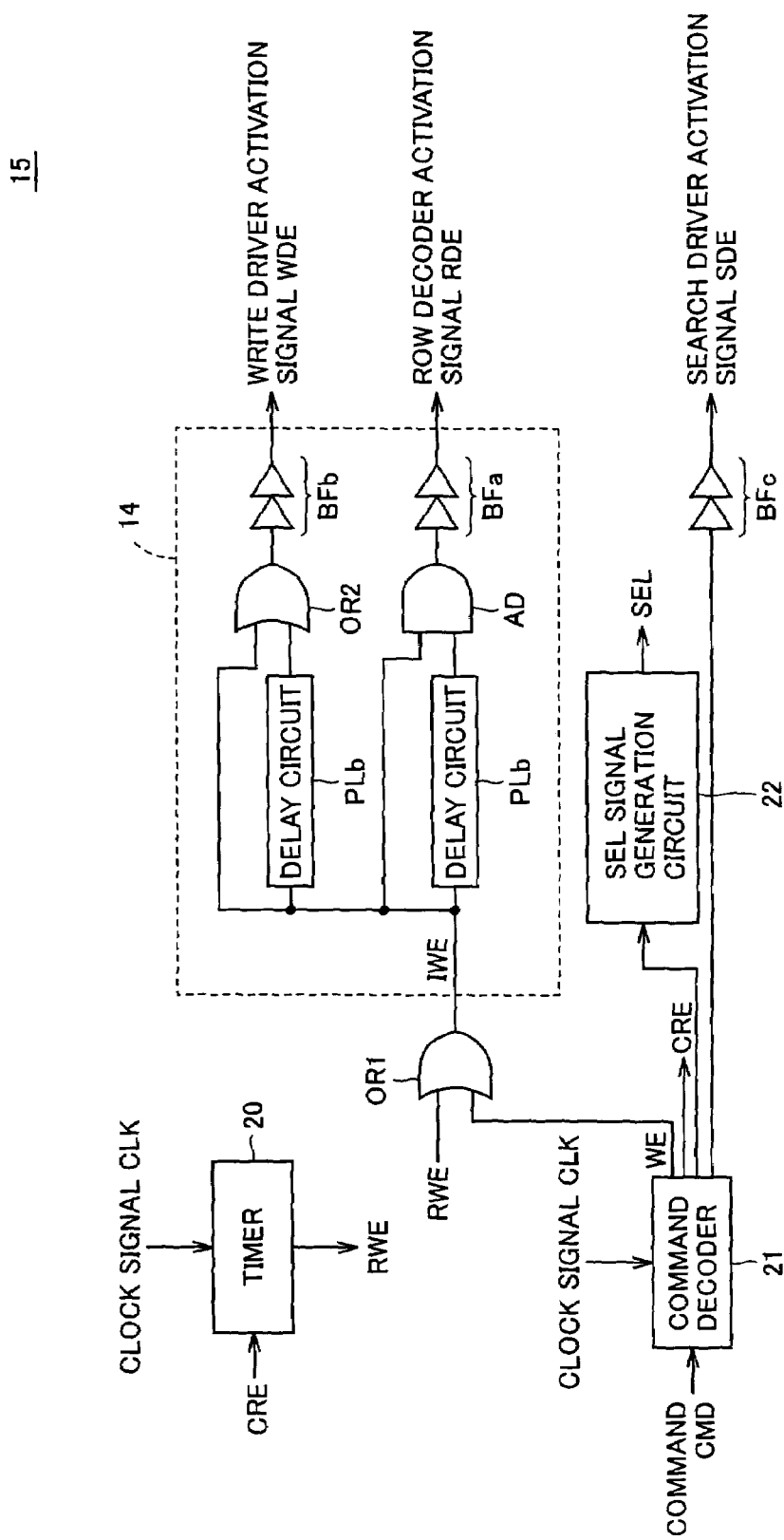
FIG. 6 illustrates a control circuit including a timing adjustment circuit according to the first embodiment of the present invention.

With reference to FIG. 6, control circuit 15 including a timing adjustment circuit 14 is described according to the first embodiment of the present invention.

In the a data write operation of the CAM CMU, timing adjustment circuit 14 of the first embodiment of the invention adjusts the timing at which the word driver band and a word driver (not shown) in row decoder 3a are activated. Specifically, when a rewrite enable signal RWE or write signal WE is input, the output timing of a write driver activation signal WDE and a row decoder activation signal RDE is adjusted.

Referring to FIG. 6, control circuit 15 includes a timer 20, a command decoder 21, an OR circuit OR1, a buffer BFc, and a SEL signal generation circuit 22. Timing adjustment circuit 14 includes an OR circuit OR2, an AND circuit AD, delay circuits PLa, PLb, and buffers BFa, BFb.

Timer 20 is activated in response to activation signal CRE. Receiving clock signal CLK, timer 20 generates and outputs rewrite enable signal RWE at predetermined intervals. Receiving command CMD defining an operation of associative memory 1 in synchronization with clock signal CLK, command decoder 21 generates control signals for example for issuing an instruction to each internal circuit. For example, command decoder 21 receives command CMD defining a data write operation to generate write enable signal WE. Further, command decoder 21 receives command CMD defining a data search operation to generate and output a search driver activation signal SDE through buffer BFc. Furthermore, command decoder 21 receives command CMD defining a cyclic read operation to generate activation signal CRE.

According to an instruction from command decoder 21, SEL signal generation circuit 22 generates control signal SEL. Specifically, in response to input of command CMD for normal data reading, SEL signal generation circuit 22 sets control signal SEL at "H" level according to the instruction from command decoder 21. In response to input of command CMD for cyclic reading, SEL signal generation circuit 22 sets control signal SEL at "L" level according to the instruction from command decoder 21.

In response to input of rewrite enable signal RWE and write enable signal WE, OR circuit OR1 outputs to timing adjustment circuit 14 write signal IWE that is the result of an OR logical operation.

In timing adjustment circuit 14, AND circuit AD receives write signal IWE and delayed write signal IWE through delay circuit PLa, performs an AND logical operation thereon and outputs the result as row decoder activation signal RDE through buffer BFa. OR circuit OR2 receives write signal IWE and delayed write signal IWE through delay circuit PLb, performs an OR logical operation thereon and outputs the result as write driver activation signal WDE through buffer BFb.

Figure 7:
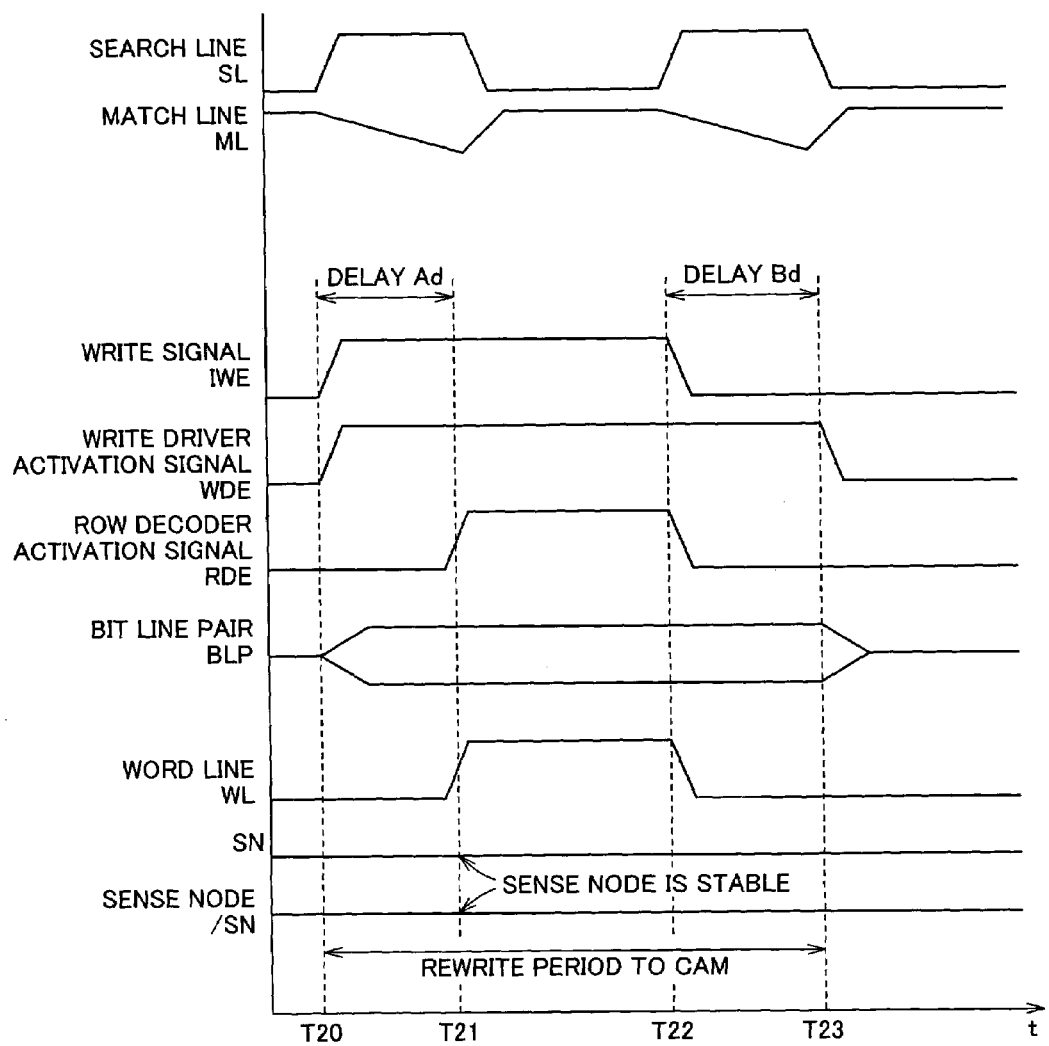
FIG. 7 illustrates how the timing adjustment circuit adjusts activation timing of a word line WL according to the first embodiment of the present invention.

With reference to FIG. 7, how timing adjustment circuit 14 in the first embodiment of the present invention adjusts the activation timing of word line WL is described.

As shown in FIG. 7, at time T20, in response to input of write signal IWE, write driver activation signal WDE rises to "H" level, namely the write driver band is activated. Accordingly, a voltage level according to input search data is transmitted to bit line pair BLP. Row decoder activation signal RDE rises to "H" level at time T21 at which delay time Ad of delay circuit PLa has passed. Thus, the word driver of row decoder 3a is activated to activate a desired word line WL according to an input address. At this time, the data level of bit line pair BLP is confirmed. Therefore, if the data does not particularly has a soft error, sense nodes SN and /SN are maintained in a stable state. Therefore, in the parallel data search operation, no malfunction occurs. At time T22 at which write signal IWE falls, row decoder activation signal RDE falls to "L" level. At time T23 at which delay time Bd of delay circuit PLb has passed, write driver activation signal WDE falls to "L" level. The number of delay stages (not shown) for example may be changed for adjusting the time period of delay Ad of delay circuit PLa to make further adjustments of the activation timing of word line WL.

Thus, the timing adjustment circuit of the present embodiment can be provided to conduct a data search more reliably without occurrence of malfunction.

Since the above-described CAM memory cells are employed, search line pair SLP and bit line pair BLP are separately provided. Therefore, even if a rewrite operation and a data search operation are performed simultaneously, there is no influence on the data search operation. In other words, the data maintenance with this configuration is completely transparent to the data search operation so that the efficiency of the search performance does not deteriorate even if this configuration is employed.

In the following, cases where soft errors could occur are described.

There could be a case in which a soft error occurs in the CAM CMU, a case in which a soft error occurs in the RAM RMU and a case in which soft errors occur in both of the CAM CMU and the RAM RMU.

In the case where the CAM CMU has a soft error, a normal data search operation of the CAM CMU cannot be ensured temporarily. However, since the same word W as that of the CAM CMU having the soft error is held in the RAM RMU at the same address, error maintenance is executed through the cyclic reading and the error correction as described above as well as rewrite to the CAM CMU. Accordingly, a normal data search operation can be ensured in a short period of time.

In the case where the RAM RMU has a soft error, a normal data search operation of the CAM CMU is ensured all the time. For the RAM RMU having the soft error, through the cyclic reading and the error correction as described above as well as rewrite to the CAM CMU, data maintenance is performed. Thus, the data in the RAM RMU is repaired in a short period of time.

In, the case where both of the CAM CMU and the RAM RMU have soft errors, a normal data search operation of the CAM CMU cannot be ensured temporarily. However, through the cyclic reading, the error correction as described above and rewrite to the CAM CMU and the RAM RMU, data maintenance is performed. Thus, a normal data search operation can be ensured in a short period of time.

It is noted that, regarding the error correction, data maintenance cannot be performed if an error of two or more bits occurs. As for a large-capacity CAM, even if several ten-thousands words are stored within a chip, the cyclic reading and error correction are regularly performed. Therefore, after a soft error of one bit of word W in the RAM RMU occurs and before the cyclic reading and error correction are performed, there is an extremely low probability of occurrence of a soft error of another bit of the same word W having the soft error, among the ten-thousands words.

Modification of the First Embodiment

In connection with the first embodiment discussed above, the description is given concerning how the resistance to soft errors is improved of the associative memory using SRAM cells as memory cells of memory arrays 2a and 2b in the CAM CMU and the RAM RMU. Instead of the SRAM cells, DRAM cells (dynamic memory cells) may also be used as CAM memory cells.

Figure 8:
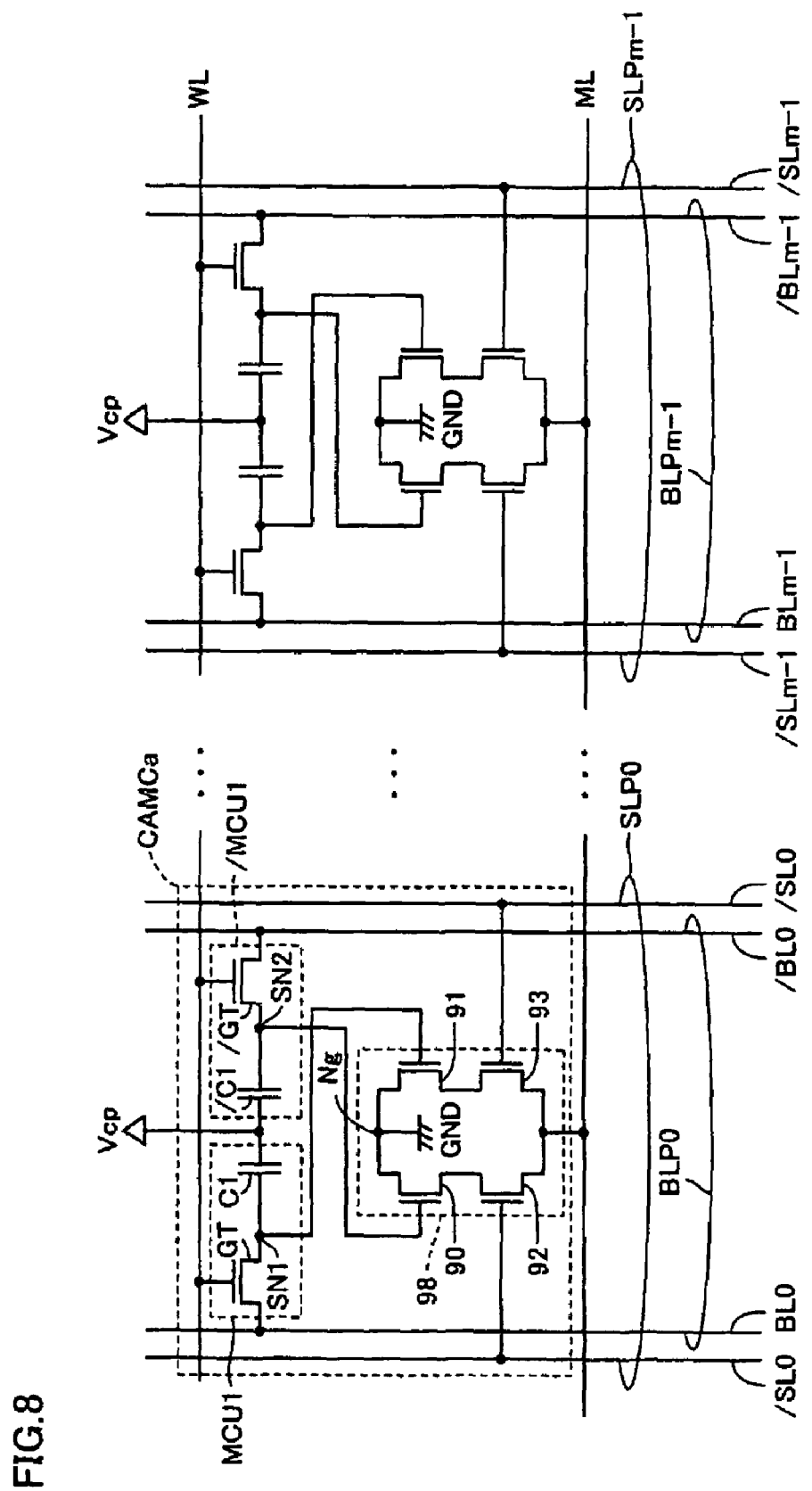
FIG. 8 shows a circuit configuration of CAM memory cells arranged in a memory array according to a modification of the first embodiment of the present invention.

Referring to FIG. 8 showing CAM memory cells CAMCa (also referred to simply as memory cells CAMCa hereinafter) arranged in a memory array 2a according to a modification of the first embodiment of the present invention, two memory cells CAMCa are provided correspondingly to bit line pair BLP0 and BLPm-1. Since the memory cells CAMCa are identical in configuration, memory cell CAMCa corresponding to bit line pair BLP0 is described here as a representative one.

Memory cell CAMCa includes memory cell units MCU1, /MCU1 and a comparison unit 98.

Memory cell units MCU1, /MCU1 include gate transistors GT, /GT and capacitor cells C1, /C1 (also referred to generally as capacitor cell C hereinafter). It is supposed here that gate transistors GT, /GT are N-channel MOS transistors. Gate transistor GT is provided between bit line BL0 and sense node SN1 and has its gate electrically coupled to word line WL. Gate transistor /GT is provided between bit line /BL0 and sense node SN2 and has its gate electrically coupled to word line WL. Capacitor cell C1 is provided between sense node SN1 and a power supply node supplied with a predetermined voltage Vcp. Capacitor cell /C1 is provided between sense node SN2 and the power supply node supplied with the predetermined voltage Vcp.

Comparison unit 98 is similar in configuration to the one described in connection with FIG. 2 and its circuit operation in a data search operation is also similar. Thus, the detailed description thereof is not repeated here. It should be noted that respective gates of transistors 90 and 91 of comparison unit 98 are electrically connected to respective sense nodes SN2 and SN1. In memory cell units MCU1 and MCU2, one of sense nodes SN1 and SN2 is set at "H" level and the other thereof is set at "L" level to hold storage data.

Memory cell units MCU1 and MCU2 are memory cells composed of gate transistors GT and capacitor cells C, namely so-called DRAM cells. As seen from a comparison with the SRAM cells described above in connection with FIG. 2, the DRAM cell has a smaller number of components, transistors for example, than that of the SRAM cell and accordingly the CAM memory cell can be formed by the DRAM cell with a considerably smaller area as compared with the SRAM cell. In other words, the DRAM cell is highly advantageous in terms of increase in degree of integration.

Thus, CAM memory cells CAMCa of the modification of the first embodiment can be used to constitute an associative memory with a remarkably reduced chip area as compared with an associative memory constituted of SRAM cells.

Since the DRAM cell holds storage data on sense node SN using electric charge of capacitor cell C, the storage data has to be rewritten periodically, namely refreshed, for keeping the data. Thus, while a data search is being conducted, the refresh operation may have to be performed. This could deteriorate data search performance. However, according to the present invention, the RAM RMU is constantly refreshed by the cyclic reading and thus a refresh operation by input of a so-called refresh command from any external unit is unnecessary. Further, for the CAM CMU as well, the data maintenance is done through the cyclic reading as well and the data is rewritten, and thus an externally conducted refresh operation is unnecessary. As described in connection with the first embodiment, the data maintenance of the DRAM cells is also transparent to the data search operation.

In this way, with the configuration described here, the chip area can be reduced and higher data reliability can be ensured without deterioration in search performance.

Second Embodiment

Figure 9:
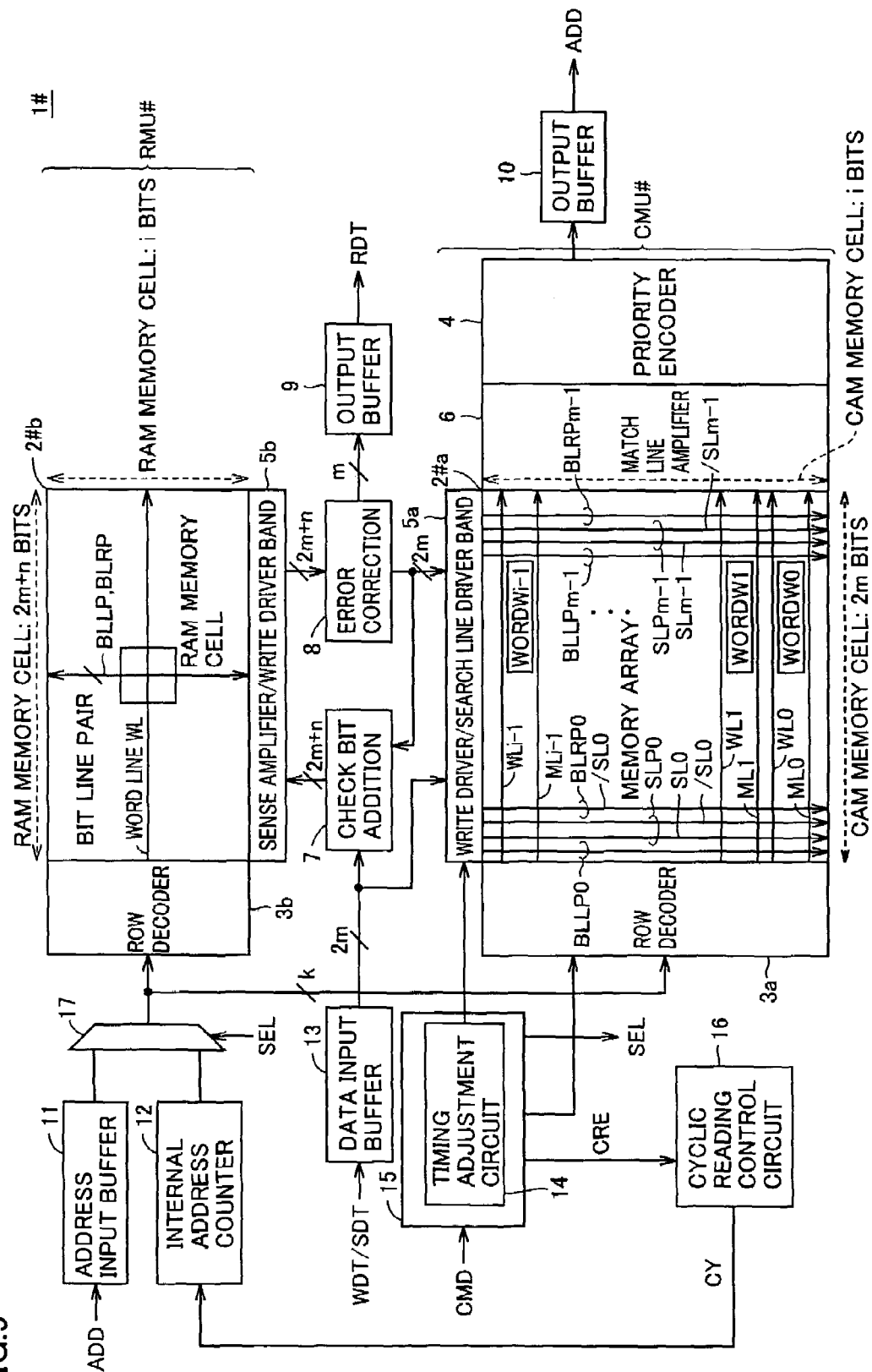
FIG. 9 shows an entire configuration of an associative memory according to a second embodiment of the present invention.

Referring to FIG. 9 showing an associative memory 1# according to a second embodiment of the present invention, a difference between associative memory 1# and associative memory 1 in FIG. 1 described above is that a CAM CMU# and a RAM RMU# are used instead of the CAM CMU and the RAM RMU respectively. Specifically, in the CAM CMU# and the RAM RMU#, memory arrays 2#a and 2#b are used instead of memory arrays 2a and 2b. Regarding other features, the associative memories are identical and the detailed description thereof is not repeated here.

Specifically, in memory array 2#a, memory cells CAMC# arranged therein are used instead of memory cells CAMC. Accordingly, the number of bits of memory array 2#b is adjusted. Memory cells CAMC# are so-called TCAM cells.

In FIG. 9, bit line pairs BLLP0, BLRP0, BLLPm-1, BLRPm-1 are shown as representative ones and search line pairs SLP0, SLPm-1 are also shown.

Figure 10:
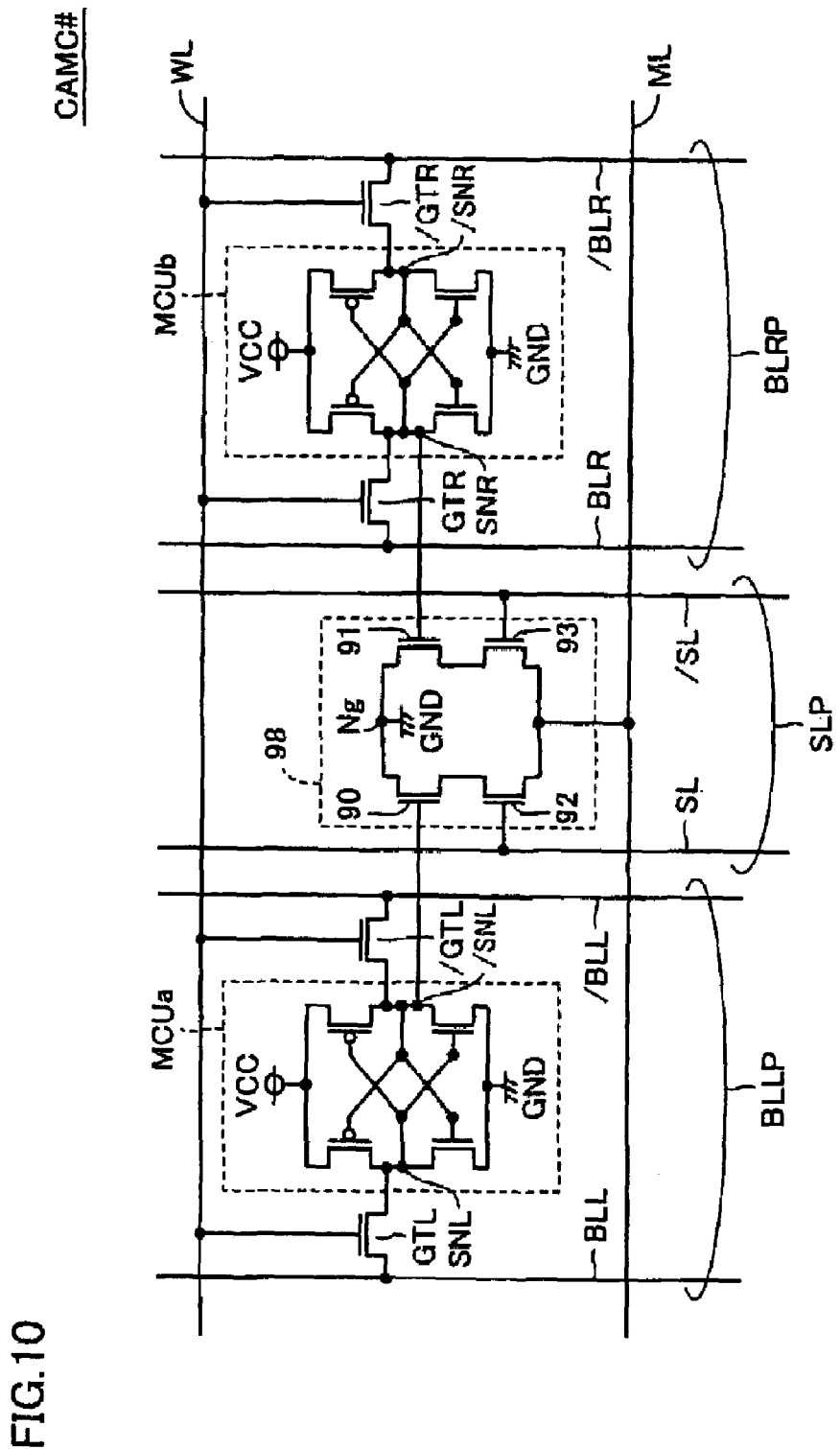
FIG. 10 shows a configuration of memory cells according to the second embodiment of the present invention.

Referring to FIG. 10, memory cell CAMC# in the second embodiment includes two memory cell units MCUa, MCUb, a comparison unit 98 and gate transistors GTL, /GTL, GTR, /GTR.

Memory cell unit MCUa corresponds to bit line pair BLLP. Memory cell unit MCUb corresponds to bit line pair BLRP. Since memory cell units MCUa and MCUb are equivalent in circuit configuration to memory cell unit MCU described in connection with the first embodiment, the detailed description thereof is not repeated here. As described above, each of memory cell units MCUa and MCUb serves as a flip-flop circuit setting one of the two sense nodes and the other thereof at different voltage levels according to data to be stored.

Gate transistor GTL is provided between sense node SNL of memory cell unit MCUa and bit line BLL of bit line pair BLLP and has its gate electrically connected to word line WL. Gate transistor /GTL is provided between sense node /SNL of memory cell unit MCUa and complementary bit line /BLL and has its gate electrically coupled to word line WL. Gate transistor GTR is provided between sense node SNR of memory cell unit MCUb and bit line BLR of bit line pair-BLRP and has its gate electrically coupled to word line WL. Gate transistor /GTR is provided between sense node /SNR and complementary bit line /BLR of bit line pair BLRP and has its gate electrically coupled to word line WL.

Comparison unit 98 receives a pair of data corresponding to respective voltage levels of sense node /SNL of memory cell unit MCUa and sense node SNR of memory cell unit MCUb and receives input search data transmitted to search line pair SLP to transmit a signal based on the result of the comparison to match line ML.

Since comparison unit 98 is similar in configuration to the one in FIG. 2 described above, the detailed description thereof is not repeated here. It should be noted that respective gates of transistors 90 and 91 of comparison unit 98 are electrically coupled to sense node /SNL of memory cell unit MCUa and sense node SNR of memory cell unit MCUb.

Since the memory cells arranged in memory array 2#b are similar in configuration to memory cells CAMC# except for search line pair SLP and comparison unit 98 of above-described memory cell CAMC#, the detailed description thereof is not repeated here.

In the above-described configuration, memory array 2#a includes memory cell units MCU of i rows×2m columns and memory array 2#b includes memory cell units MCU of i rows×(2m+n) columns. The number of bits of input search data SDT that is input in a data search operation is m (m bits).

A difference between the CAM and the TCAM is whether their memory cells are binary storage or ternary storage. The memory cell of the TCAM stores three states: "0", "1" and "X (don't care)".

It is assumed here that memory cell CAMC# stores data "0". In this example, in the storage state of data "0", sense node /SNL is set at "H" level and sense node SNR is set at "L" level.

It is supposed that a data search operation is performed and data "0" is input to search line pair SLP. In this example, search line SL is set at "L" level and complementary search line /SL is set at "H" level.

In this case, in comparison unit 98, transistors 90 and 93 are turned on. However, match line ML is not electrically coupled to ground voltage GND so that match line ML maintains the voltage level of power supply voltage VCC. As described above, in this case, the input storage data and the storage data hit (match).

In contrast, it is supposed that data "1" is input to search line pair SLP. In this example, search line SL is set at "H" level and complementary search line /SL is set at "L" level.

In this case, in comparison circuit 98, transistors 90 and 92 are turned on and accordingly match line ML and node Ng are electrically coupled. Namely, the voltage level of match line ML is pulled down by ground voltage GND. As described above, in this case, the input search data and the storage data miss (mismatch).

Thus, in memory cell CAMC#, the search operation can be performed similarly to CAM memory cell CAMC.

Further, memory cell CAMC# stores another state "X (don't care)". In this storage state, both of sense node /SNL and sense node SNR are set at "L" level.

When a data search operation is executed, since sense node /SNL and sense node SNR are both at "L" level, transistors 92 and 93 of comparison unit 98 are both in a turned-off state. Thus, in both of the cases where data "0" is input and data "1" is input to search line pair SLP, ground voltage GND and match line ML are not electrically connected so that the result of the comparison is always "hit". Memory cell CAMC# can thus store the "X" state that is always "hit".

Storage data from which storage information is composed and which is a combination of ternary data bits is especially advantageous when any operation is performed on IP (internet protocol) packets in a network system. For example, for the sake of simplicity, it is assumed here that a destination address of a packet is represented by 4 bits. Here, it is further assumed that the destination address of a certain packet is "1XXX" (on the condition that the leading bit is "1", the remaining address bits may have any values) and a predetermined operation is performed on the packet. An associative storage memory of the CAM or TCAM is used to search for, when the packet arrives at the system, the destination address of the packet to determine whether the address match address "1XXX".

In this case, it is necessary, before the arrival of the packet, data of "1XXX" is stored in the CAM or TCAM. When the CAM of the normal binary storage is employed, it is necessary to store eight states: "1000", "1001", "1010", "1011", "1100", "1101", "1110", and "1111". Thus eight words are consumed for searching for the destination address of the packet.

In contrast, the TCAM can store the state "X". Therefore, it is only necessary to store one word "1XXX". When the bit number of the destination address is larger, the difference in number of words to be used accordingly increases. Thus, the TCAM can be used to store various types of data, using a small number of words. Actually, the IP packet includes, in addition to the information about the destination address, various types of information including the IP address of the transmitter, information regarding communication quality and version number of the IP protocol for example. It is seen from the above that the TCAM is considerably useful for a search operation of such information.

The TCAM memory cell and the CAM memory cell are different in cell configuration only and are common in search operation using match line ML. Therefore, the configuration described in connection with the first embodiment is applicable to the TCAM memory cell.

Modification of the Second Embodiment

Regarding the second embodiment discussed above, the description is given about how the resistance to soft errors is improved of the associative memory using SRAM cells as memory cells of memory arrays 2a# and 2b# in the CAM CMU# and the RAM RMU#. Instead of the SRAM cells, DRAM cells may also be used as TCAM cells.

Figure 11:
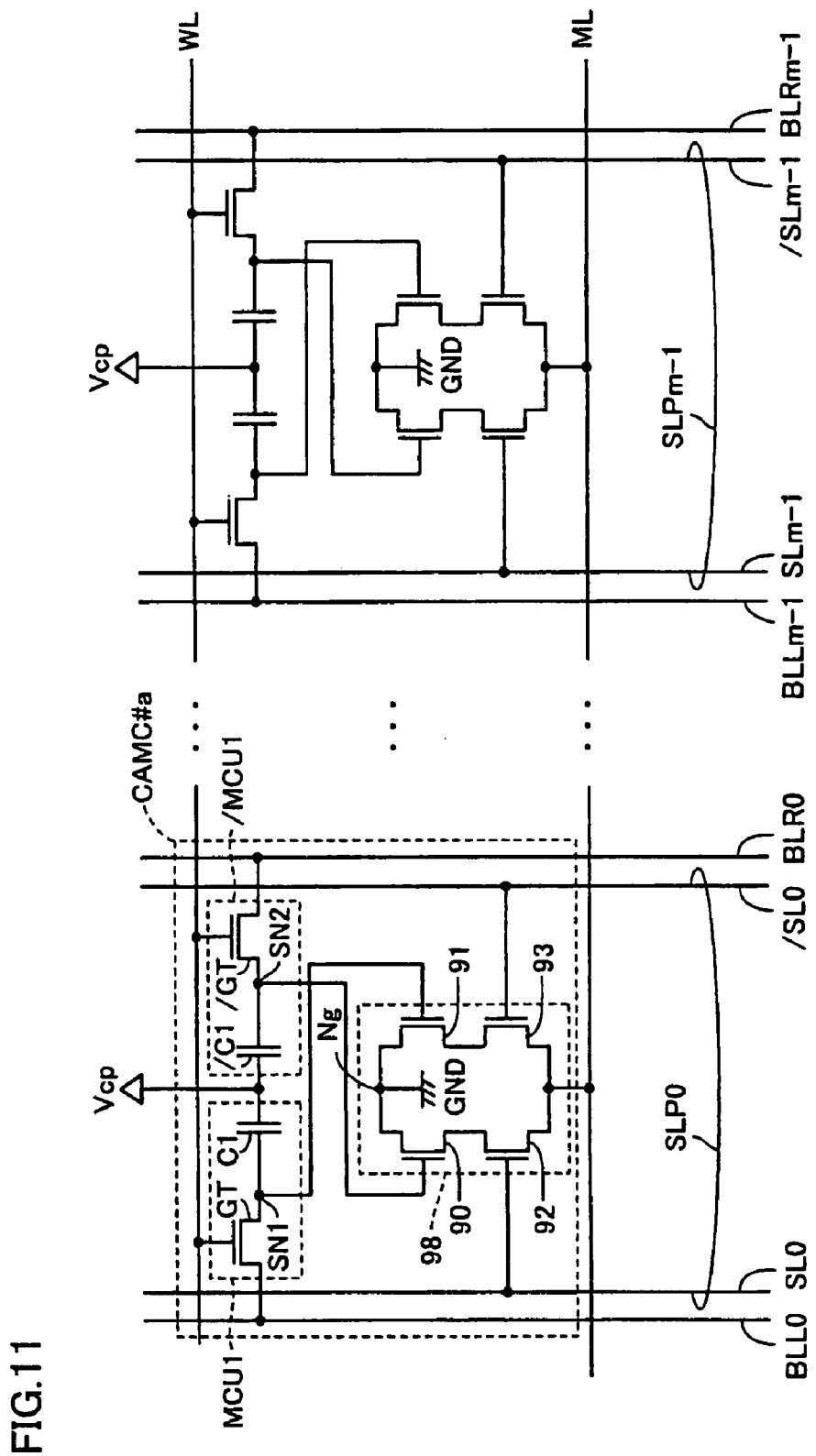
FIG. 11 shows a circuit configuration of CAM memory cells arranged in a memory array according to a modification of the second embodiment.

Referring to FIG. 11 showing CAM memory cells CAMCa# (also referred to simply as memory cells CAMCa# hereinafter) arranged in a memory array 2a according to a modification of the second embodiment, two memory cells CAMCa# are provided correspondingly to bit lines BLL0, BLR0 and bit lines BLLm-1, BLRm-1. Since the memory cells CAMCa# are identical in configuration, memory cell CAMCa# corresponding to paired bit lines BLL0 and BLR0 is described as a representative memory cell.

Since memory cell CAMC#a is similar in configuration to that in FIG. 8 described above, the detailed description thereof is not repeated here. Memory cell CAMC#a differs from memory cell CAMCa in FIG. 8 in that the complementary bit line is not provided while memory cell CAMCa has complementary bit line /BL and corresponding memory cell unit /MCU. Regarding other features described in connection with FIG. 8, the memory cells are similar to each other and the detailed description thereof is not repeated here.

Thus, memory cell units MCU corresponding respectively to bit line BLL and bit line BLR store respective data that are not complementary to but independent of each other.

Memory cell units MCU1 and MCU2 are each composed of gate transistor GT and capacitor cell C, namely they are so-called DRAM cells. Therefore, as seen from a comparison with the SRAM cells in FIG. 10 described above, the DRAM cell has a smaller number of components, transistors for example, and thus can be formed with a considerably smaller area as compared with the SRAM cell. The DRAM cell is highly advantageous in terms of increase in degree of integration.

Thus, CAM memory cells CAMC#a of the modification of the second embodiment can be used to configure an associative memory that is remarkably reduced in chip area as compared with an associative memory configured using SRAM cells.

Further, as described above, since the DRAM cell holds storage data on sense node SN using electric charge of capacitor cell C, the storage data has to be periodically rewritten, namely refreshed, for maintaining the data. However, the RAM RMU with the configuration of the present invention is constantly refreshed by the cyclic reading and thus the refresh operation by input of a so-called refresh command from an external unit is unnecessary. Further, in the CAM CMU as well, data maintenance is performed similarly by the cyclic reading and the data is rewritten, and thus externally performed refresh operation is unnecessary. As described in connection with the first embodiment, the data maintenance of the DRAM cells is also transparent to the data search operation.

Accordingly, the configuration of the present invention can be used to reduce the chip area and ensure higher data reliability without deterioration in search performance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An associative memory comprising:
a first memory unit including a plurality of memory cell rows that store data and performing a matching comparison between input search data and storage data stored in advance correspondingly to each memory cell row;
a second memory unit storing, correspondingly to each memory cell row, information that is the same as said storage data stored in said first memory unit and check data used for checking said storage data; and
a control unit for determining whether said storage data has a soft error based on said check data stored in said second memory unit and correcting said storage data stored in said first memory unit.

2. The associative memory according to claim 1, wherein said second memory unit includes a read circuit for reading the storage data and the check data stored in a memory cell row that is selected according to an input address, and
said control unit includes an error correction circuit determining whether the storage data read by said read circuit has error bit data based on the check data read by said read circuit and correcting the error bit data of the storage data to output the corrected storage data.

3. The associative memory according to claim 2, wherein said first memory unit and said second memory unit operate independently of each other, and
said control unit further includes an internal address generation circuit incrementing an address in synchronization with a periodic signal to input the address to said first memory unit and said second memory unit.

4. The associative memory according to claim 3, wherein said first memory unit and said second memory unit each include a write circuit for writing write data to said memory cell row that is selected according to the input address, and
said error correction circuit outputs the corrected storage data as said write data to the write circuit of said first memory unit and to the write circuit of said second memory unit.

5. The associative memory according to claim 4, wherein said plurality of memory cell rows of said first memory unit each have a plurality of memory cells that are arranged in rows and columns and each store one-bit data of the storage data,
said first memory unit includes:
a plurality of word lines corresponding to respective memory cell rows;

a plurality of bit lines corresponding to respective memory cell columns and receiving said write data transmitted from the write circuit of said first memory unit; and a selection circuit activating a selected word line of a corresponding memory cell row according to an input address, and said control unit further includes a timing adjustment circuit for activating said selected word line by said selection circuit after level of said write data transmitted to said plurality of bit lines to be written by said write circuit is confirmed.

6. The associative memory according to claim 5, wherein said timing adjustment circuit outputs to said write circuit a first control signal for starting transmission of said write data to said plurality of bit lines and thereafter, when a predetermined time has passed since the output of said first control signal, outputs to said selection circuit a second control signal for activating said selected word line.

7. The associative memory according to claim 2, wherein said first memory unit and said second memory unit each include a write circuit for writing write data to said memory cell row that is selected according to the input address, and said error correction circuit outputs the corrected storage data as said write data to the write circuit of said first memory unit and to the write circuit of said second memory unit.

8. The associative memory according to claim 7, wherein said plurality of memory cell rows of said first memory unit each have a plurality of memory cells that are arranged in rows and columns and each store one-bit data of the storage data, said first memory unit includes:

a plurality of word lines corresponding to respective memory cell rows;

a plurality of bit lines corresponding to respective memory cell columns and receiving said write data transmitted from the write circuit of said first memory unit; and a selection circuit activating a selected word line of a corresponding memory cell row according to an input address, and said control unit further includes a timing adjustment circuit for activating said selected word line by said selection circuit after level of said write data transmitted to said plurality of bit lines to be written by said write circuit is confirmed.

9. The associative memory according to claim 8, wherein said timing adjustment circuit outputs to said write circuit a first control signal for starting transmission of said write data to said plurality of bit lines and thereafter, when a predetermined time has passed since the output of said first control signal, outputs to said selection circuit a second control signal for activating said selected word line.

10. The associative memory according to claim 1, wherein said first memory unit further includes a match line corresponding to said each memory cell row for determining whether said input search data match said storage data, said each memory cell row has a plurality of memory cells each storing one-bit data of the storage data, and said memory cells each include:

a first cell unit having a first storage node holding first one-bit data;

a second cell unit having a second storage node holding second one-bit data; and a comparison circuit comparing a pair of the one-bit data held by said first storage node and the one-bit data held by said second storage node with one-bit data of said input search data and selectively driving a corresponding match line according to result of the comparison.

11. The associative memory according to claim 10, wherein said first cell unit and said second cell unit are composed using one of a dynamic memory cell and a static memory cell, the dynamic memory cell having a capacitor for holding the one-bit data of a corresponding one of said first storage node and said second storage node, and the static memory cell having a flip-flop circuit for holding the one-bit data of said corresponding one of said first storage node and said second storage node.

12. The associative memory according to claim 1, wherein said each memory cell row of said second memory unit has a plurality of memory cells each storing one-bit data of the storage data, and said memory cells each correspond to one of a dynamic memory cell and a static memory cell, the dynamic memory cell having a capacitor for holding one-bit data of said storage data, and the static memory cell having a flip-flop circuit for holding said storage data.

* * * * *